US009992049B1

(12) United States Patent
Novellini

(10) Patent No.: US 9,992,049 B1
(45) Date of Patent: Jun. 5, 2018

(54) NUMERICALLY CONTROLLED OSCILLATOR FOR FRACTIONAL BURST CLOCK DATA RECOVERY APPLICATIONS

(71) Applicant: Xilinx, Inc., San Jose, CA (US)

(72) Inventor: Paolo Novellini, Milan (IT)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 15/186,006

(22) Filed: Jun. 17, 2016

(51) Int. Cl.
*H04L 7/00* (2006.01)
*H04L 27/152* (2006.01)

(52) U.S. Cl.
CPC .......... *H04L 27/152* (2013.01); *H04L 7/0079* (2013.01)

(58) Field of Classification Search
CPC ......... H03L 7/0807; H03L 7/087; H03L 7/07; H04L 7/10; H04L 7/02
See application file for complete search history.

(56) References Cited

U.S. PATENT DOCUMENTS

| | | | | |
|---|---|---|---|---|
| 6,147,713 A * | 11/2000 | Robbins | ............... | H04N 5/4401 348/555 |
| 6,456,164 B1 * | 9/2002 | Fan | ........................ | H03K 23/68 327/115 |
| 7,519,750 B2 * | 4/2009 | Scouten | ................. | H03L 7/0807 327/156 |
| 8,666,010 B1 * | 3/2014 | Novellini | .................. | H04L 7/02 327/147 |
| 8,681,919 B1 * | 3/2014 | Novellini | ............... | H03D 3/241 327/156 |
| 8,971,468 B1 * | 3/2015 | Novellini | ................. | H04L 1/205 327/163 |
| 9,036,764 B1 * | 5/2015 | Hossain | ................... | H03L 7/087 375/355 |
| 9,143,316 B1 * | 9/2015 | Novellini | ............... | H04L 7/0331 |
| 9,306,730 B1 * | 4/2016 | Shu | ........................ | H03L 7/1974 |
| 9,509,319 B1 * | 11/2016 | Chattopadhyay | ..... | H03L 7/0807 |
| 2006/0133559 A1 * | 6/2006 | Glass | .................... | H03L 7/0891 375/376 |

(Continued)

OTHER PUBLICATIONS

Xilinx Inc., Fractional Burst Clock Data Recovery for XG-PON Application, Application Note 7 Series FPGAs, XAPP 1083 (v1.0.2), Jun. 17, 2014, pp. 1-19, San Jose, USA.*

(Continued)

*Primary Examiner* — Chieh M Fan
*Assistant Examiner* — Berhanu Tadese
(74) *Attorney, Agent, or Firm* — Gerald Chan

(57) ABSTRACT

A receiver for processing a data stream includes: a bursty phase detector having a first voltage-controlled oscillator configured to provide a first VCO phase, a signal stream detector configured to provide a data stream phase and a data stream detect signal, and a delay component configured to receive the data stream; a clocking circuit coupled to receive an output of the delay component, the data stream phase, and the data stream detect signal, the clocking circuit configured to provide a second VCO phase at an output of the clocking circuit, wherein the clocking circuit is configured to operate based on a fractional relationship between a reference clock frequency and an output frequency; and a data sample selector with a first input coupled to the output of the delay component, and a second input coupled to the output of the clocking circuit.

21 Claims, 8 Drawing Sheets

(56) References Cited

U.S. PATENT DOCUMENTS

| | | | | |
|---|---|---|---|---|
| 2008/0124092 A1* | 5/2008 | Dvir | H04L 7/0337 | 398/155 |
| 2009/0092213 A1* | 4/2009 | Eker | H03L 7/087 | 375/362 |
| 2010/0067633 A1* | 3/2010 | Den Besten | H03L 7/10 | 375/373 |
| 2010/0091921 A1* | 4/2010 | Den Besten | H03L 7/189 | 375/354 |
| 2010/0172457 A1* | 7/2010 | Den Besten | H03L 7/0991 | 375/376 |
| 2010/0189433 A1* | 7/2010 | Trojer | H04Q 11/0067 | 398/8 |
| 2010/0221000 A1* | 9/2010 | Yang | H04B 10/03 | 398/38 |
| 2010/0232558 A1* | 9/2010 | Terada | H03L 7/0805 | 375/374 |
| 2011/0001530 A1* | 1/2011 | Nishi | H04L 7/033 | 327/162 |
| 2011/0001531 A1* | 1/2011 | Nishi | H03L 7/0807 | 327/162 |
| 2011/0135306 A1* | 6/2011 | Kim | H04J 3/0685 | 398/68 |
| 2012/0250360 A1* | 10/2012 | Orr | H02M 3/3376 | 363/21.02 |
| 2013/0216014 A1* | 8/2013 | Kong | H03L 7/07 | 375/376 |
| 2013/0321047 A1* | 12/2013 | Guasti | H03L 7/0807 | 327/156 |
| 2014/0105614 A1* | 4/2014 | Nishi | H03L 7/0807 | 398/155 |
| 2014/0286469 A1* | 9/2014 | Shibasaki | H04L 7/0079 | 375/373 |
| 2016/0352504 A1* | 12/2016 | Gu | H04L 7/0087 | |

OTHER PUBLICATIONS

Xilinx, Inc. "Fractional Burst Clock Data Recovery for XG-PON Application", Application Note 7 Series FPGAs, XAPP 1083 (v1.0.2), Jan. 17, 2014, pp. 1-19, San Jose, USA.

Wikipedia, "Euclidean algorithm", Sep. 2, 2015, pp. 1-34, https://en.wikipedia.org/wiki/Euclidean_algorithm.

* cited by examiner

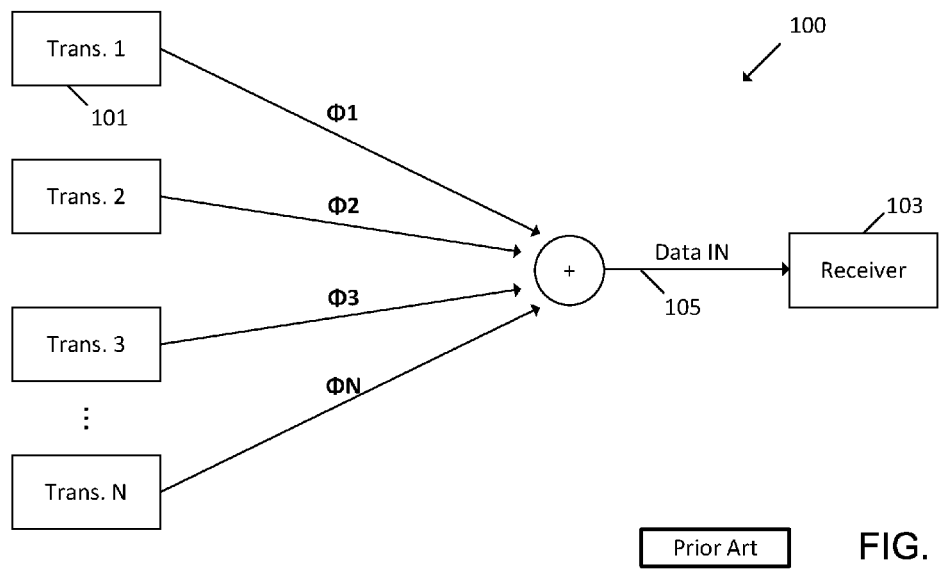
Prior Art  FIG. 1
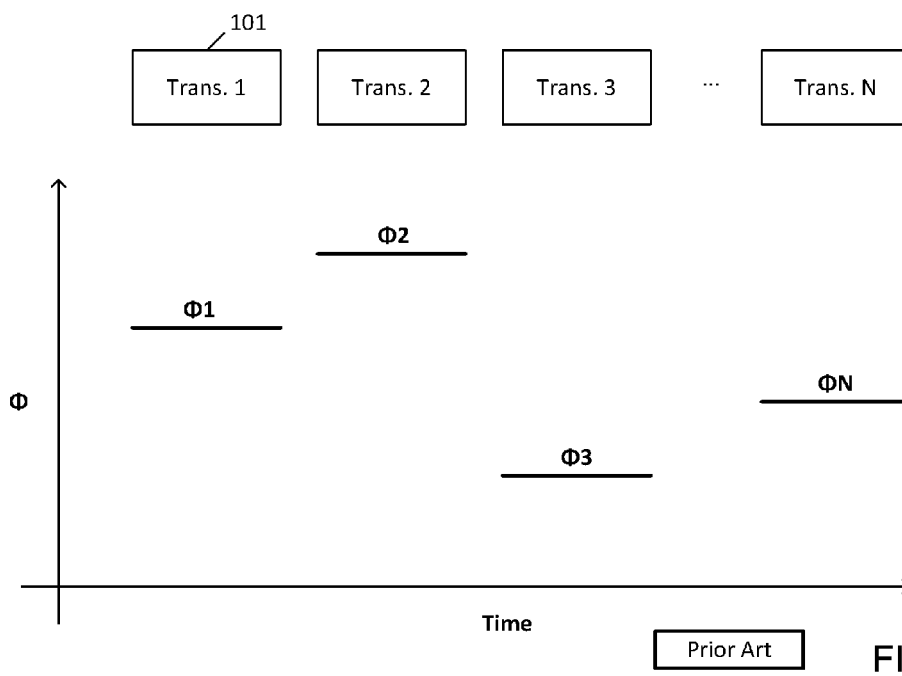
Prior Art  FIG. 2

NUMERICALLY CONTROLLED OSCILLATOR FOR FRACTIONAL BURST CLOCK DATA RECOVERY APPLICATIONS

FIELD OF THE APPLICATION

An embodiment described herein relates generally to a phase detector, and in particular to a phase detector for processing data streams of a bursty data system where fractional relationships may be encountered.

BACKGROUND

Bursty data systems involve several transmitters communicating with a single receiver over a shared medium using a time-sharing technique. In a bursty data system, different transmitters are provided different time slots during which they can communicate exclusively with the receiver. The transmitters in the bursty data system all transmit data at the same frequency, but different phases. For a receiver to accurately process the data being transmitted by a transmitter, the phase of the data stream must be quickly detected in order for the receiver to accurately sample data from the data stream. Acquiring the phase of the data stream allows the receiver to sample data from the data stream at points where the signal representing the data stream is more reliable (e.g., less affected by local noise). The time it takes for the receiver to detect the phase of the data stream and to begin accurately sampling the data using the detected phase relative to the start of data sampling is referred to as locking time. A goal of phase detection in a bursty data system is to minimize the locking time.

For data systems that are non-bursty in nature (e.g., one to one correspondence between transmitter and receiver), a phase-locked-loop (PLL) is used at the receiver to perform phase detection on incoming data. The PLL includes a phase detector that compares the incoming data stream to phase information output by a voltage controlled oscillator (VCO) to generate an error phase of the data relative to the phase information output by the VCO. The error phase is fed back to the VCO, which updates its phase information to account for the error, and this process continues until the phase information output by the VCO is in sync with the data stream.

One technique for utilizing a PLL for a bursty data system involves appending a preamble to the beginning of a data stream being transmitted from a transmitter to the receiver. The preamble is a fixed length of bits that are used by the receiver to perform phase detection prior to sampling the data stream. Although the PLL will eventually detect the phase of the data stream using the preamble, it does so very slowly, and as such a long preamble length is required to ensure that the phase of the data stream is accurately detected before sampling of the data stream occurs. This technique is undesirable for use within a bursty data system because it requires a long preamble length which leads to an inefficient usage of bandwidth and a long locking time. Moreover, this technique fails to take into account that each transmitter is only allocated a fixed time segment within which its transmitted data stream must be sampled, and a long preamble will lead to too much of the time segment being utilized for phase detection.

Another technique involves utilizing dedicated circuitry in combination with a PLL for performing phase detection. A data stream is initially transmitted from a transmitter to the receiver with a preamble with a fixed pattern appended to the beginning of the data stream. Dedicated circuitry at the receiver is used to perform phase detection on the preamble and steer a VCO of the PLL in order to accurately sample the data stream. The size of the preamble is determined by the speed of the dedicated circuitry. By increasing the speed of the dedicated circuitry, the time it takes to detect the phase from the preamble can be decreased. Even though the locking time is reduced with this technique, it requires the use of dedicated circuitry operating at a very fast speed which can become quite costly. Moreover, even though preamble length can be reduced, a positive locking time is still required in order to accurately perform sampling of the data stream.

Another technique involves using a zero preamble length to perform phase detection on a data stream, but requires that the transmitters communicate with the receiver in a predictable cyclical manner.

The above techniques involve an integer relationship between the sample frequency and the frequency of the data stream. In accordance with one or more embodiments described herein, a fractional relationship may be encountered in some cases, and a phase detector for processing data streams of a bursty data system where fractional relationships may be encountered is described herein.

SUMMARY

A receiver for processing a data stream includes: a bursty phase detector having a first voltage-controlled oscillator configured to provide a first VCO phase, a signal stream detector configured to provide a data stream phase and a data stream detect signal, and a delay component configured to receive the data stream; a clocking circuit coupled to receive an output of the delay component, the data stream phase, and the data stream detect signal, the clocking circuit configured to provide a second VCO phase at an output of the clocking circuit, wherein the clocking circuit is configured to operate based on a fractional relationship between a reference clock frequency and an output frequency; and a data sample selector with a first input coupled to the output of the delay component, and a second input coupled to the output of the clocking circuit.

Optionally, the bursty phase detector further comprises: a first phase detector with a first input coupled to receive the data stream, and a second input coupled to the first voltage-controlled oscillator, the first phase detector configured to provide a first phase error; and a sample selector coupled to receive a sum of the first VCO phase and the first phase error, and to receive the data stream, the sample selector configured to provide a data stream sample; wherein the signal stream detector is coupled to the sample selector, and wherein the signal stream detector is configured to receive the sum of the first VCO phase and the first phase error, and to generate the data stream phase and the data stream detect signal.

Optionally, the data stream comprises a preamble segment and a data segment.

Optionally, the preamble segment is for triggering the signal stream detector to generate the data stream detect signal.

Optionally, the receiver further includes an adder for generating the sum of the first VCO phase and the first phase error.

Optionally, the delay component is configured to store the data stream for a time period greater than, or equal to, a processing time for generating the data stream phase and the data stream detect signal.

Optionally, the clocking circuit comprises: a second voltage-controlled oscillator with a first input coupled to receive the data stream phase, and a second input coupled to receive the data stream detect signal; and wherein the second voltage-controlled oscillator is configured to provide the second VCO phase at an output of the second voltage-controlled oscillator.

Optionally, the clocking circuit further comprises: a second phase detector with a first input coupled to the output of the delay component, and a second input coupled to the output of the second voltage-controlled oscillator, a low-pass filter with an input connected to an output of the second phase detector, and an output coupled to a third input of the second voltage-controlled oscillator, wherein the output of the low pass filter is decoupled from the third input of the second voltage-controlled oscillator to generate the second VCO phase that has the fractional relationship between the reference clock frequency and the output frequency.

Optionally, the second phase detector is configured to receive the data stream from the delay component after the second VCO phase is aligned with a phase of the data stream.

Optionally, the second voltage-controlled oscillator comprises: a first adder coupled to the low-pass filter, wherein the first adder is configured to receive a center frequency signal; a multiplexer with a first input coupled to receive the data stream phase, a second input coupled to an output of the first adder, and a control input coupled to receive the data stream detect signal; and an n-bit register with an input coupled to an output of the multiplexer, and an output coupled to the first adder.

Optionally, the receiver further includes a second adder for providing the center frequency signal, wherein the second adder is coupled to a quotient input representing an integer portion of the second VCO phase.

Optionally, the receiver further includes a sigma-delta circuit, wherein an output of the sigma-delta circuit represents a fractional portion of the second VCO phase.

Optionally, the sigma-delta circuit comprises: a m-bit register; a third adder with a first input configured to receive a remainder, and a second input connected to an output of the m-bit register; a modulus circuit connected to the third adder and configured to receive a divisor input, wherein the m-bit register is connected to an output of the modulus circuit; and a comparator connected to the modulus circuit, wherein the comparator is configured to output a "1" if an input to the comparator is less than the remainder or to output a "0" if the input of the comparator is not less than the remainder.

Optionally, the multiplexer is configured to select the data stream phase upon receipt of the data stream detect signal.

Optionally, the low-pass filter is configured to remove local noise associated with the output of the second phase detector.

Optionally, the second voltage-controlled oscillator is configured to provide the second VCO phase that is aligned with a phase of the data stream based on the data stream phase generated by the signal stream detector.

A method for processing a data stream having fractional relationships between a reference clock frequency and an output frequency, the method comprising: receiving data at an input of a bursty phase detector; generating a data stream phase and a data stream detect signal using a first branch of the bursty phase detector, wherein the data stream phase is generated base on at least a sum of a first VCO phase and a phase error, and wherein the data stream detect signal is generated based on at least the sum of a first VCO phase and a phase error and the data stream; delaying the data stream for a time period greater than, or equal to, a processing time for generating a data stream phase and a data stream detect signal using a delay component at a second branch of the bursty phase detector; generating a second VCO phase using a clocking circuit, wherein the clocking circuit is configured to operate base on a fractional relationship between the reference clock frequency and the output frequency; and transmitting the second VCO phase to a data sample selector; and performing data sampling on the data stream at the data sample selector based on at least the second VCO phase.

Optionally, the data stream comprises a preamble segment and a data segment, and wherein the generating of the data stream detect signal is triggered by the preamble segment.

Optionally, the method further includes determining a sum of the VCO phase and a phase error.

Optionally, the second VCO phase is generated so that the second VCO phase is aligned with a phase of the data stream.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments is rendered, and illustrated in the accompanying drawings. These drawings depict only exemplary embodiments and are not therefore to be considered limiting of its scope.

FIG. 1 illustrates an example of a bursty data system.

FIG. 2 illustrates an example phase profile for different clients of a bursty data system.

DETAILED DESCRIPTION

Figure 3:
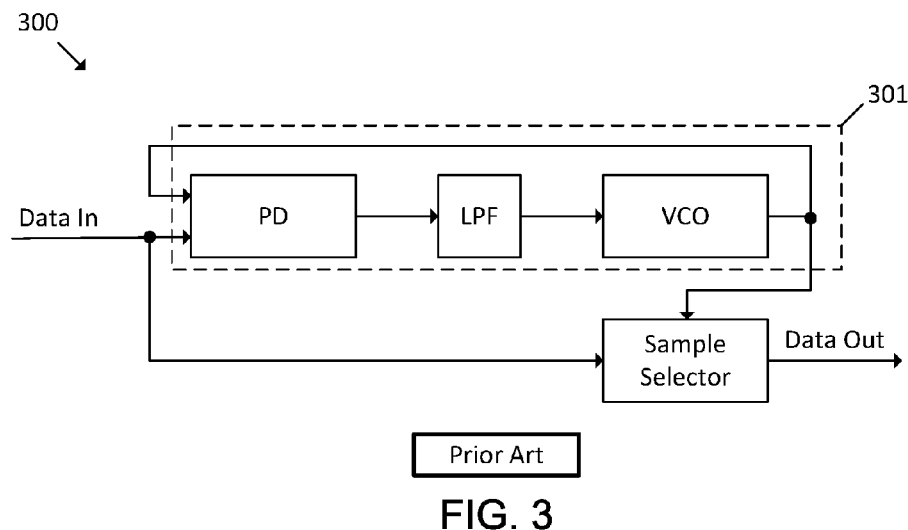
FIG. 3 illustrates a receiver and its application within a bursty data system.

Various embodiments are described hereinafter with reference to the figures. It should be noted that the figures are not necessarily drawn to scale, and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated, or not so explicitly described. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiments" in various places throughout this specification are not necessarily referring to the same embodiment or embodiments.

FIG. 1 is a block diagram illustrating an example bursty data system 100. Bursty data systems involve several transmitters 101 communicating with a single receiver 103 over a shared medium 105 using a time-sharing technique. In a bursty data system, different transmitters 101 are provided different time slots during which they can communicate exclusively with the receiver 103. The transmitters 101 in the bursty data system all transmit data at the same frequency, but different phases $\varphi 1$, $\varphi 2$, $\varphi 3$, $\varphi N$. FIG. 2 illustrates an example phase profile for different transmitters 101 of a bursty data system. As illustrated in FIG. 2, each transmitter 101 communicates exclusively with the receiver for a given period of time during which data is transmitted at a given phase.

For a receiver 103 to accurately process the data stream being transmitted by a transmitter 101, the phase of the data stream must be quickly detected in order for the receiver 103 to accurately sample data from the data stream. Acquiring the phase of the data stream allows the receiver 103 to sample data from the data stream at points where the signals representing the data stream are more reliable (e.g., less affected by local noise). The time it takes for the receiver 103 to detect the phase of the data stream and to begin accurately sampling the data using the detected phase relative to the start of data sampling is referred to as locking time. A goal of phase detection in a bursty data system is to minimize the locking time.

For data systems that are non-bursty in nature (e.g., one to one correspondence between transmitter and receiver), a phase-locked-loop (PLL) is used at the receiver to perform phase detection on incoming data. The PLL includes a phase detector that compares the incoming data stream to phase information output by a voltage-controlled oscillator to generate an error phase of the data relative to the phase information output by the voltage-controlled oscillator. The error phase is fed back to the voltage-controlled oscillator, which updates its phase information to account for the error, and this process continues until the phase information output by the voltage-controlled oscillator is in sync with the data stream.

One technique for utilizing a PLL for a bursty data system involves appending a preamble to the beginning of a data stream being transmitted from a transmitter to the receiver. The preamble is a fixed length of bits that are used by the receiver to perform phase detection prior to sampling the data stream. Although the PLL will eventually detect the phase of the data stream using the preamble, it does so very slowly, and as such a long preamble length is required to ensure that the phase of the data stream is accurately detected before sampling of the data stream occurs. This technique is undesirable for use within a bursty data system because it requires a long preamble length which leads to an inefficient usage of bandwidth and a long locking time.

Moreover, this technique fails to take into account that each transmitter is only allocated a fixed time segment within which its transmitted data stream must be sampled, and a long preamble will lead to too much of the time segment being utilized for phase detection.

Another technique involves utilizing dedicated custom circuitry in combination with a PLL for performing phase detection. A data stream is initially transmitted from a transmitter to the receiver with a preamble that includes a fixed pattern appended to the beginning of the data stream. Dedicated custom circuitry at the receiver is used to perform phase detection on the preamble and steer a voltage-controlled oscillator of the PLL in order to accurately sample the data stream. The size of the preamble is determined by the speed of the dedicated custom circuitry. By increasing the speed of the dedicated custom circuitry, the time it takes to detect the phase from the preamble can be decreased. Even though the locking time is reduced with this technique, it requires the use of dedicated custom circuitry operating at a very fast speed which can become quite costly. Moreover, even though preamble length can be reduced, a positive locking time may still be required in order to accurately perform sampling of the data stream.

Another technique involves using a zero preamble length to perform phase detection on a data stream, but requires that the transmitters communicate with the receiver in a predictable cyclical manner.

FIG. 3 illustrates a receiver 300 and its application within a bursty data system. The receiver 300 includes a phase-locked loop (PLL) 301 and a sample selector. The PLL 301 includes a phase detector PD, a low-pass filter LPF, and a voltage-controlled oscillator VCO.

The phase detector PD includes a first input coupled to receive the incoming data stream and a second input coupled to an output of the voltage-controlled oscillator VCO. The phase detector PD is configured to generate a phase error at its output.

The low-pass filter LPF includes an input coupled to the output of the phase detector PD and an output coupled to an input of the voltage-controlled oscillator VCO. The low-pass filter LPF is configured to remove local noise associated with the output of the phase detector PD (e.g. phase error).

The voltage-controlled oscillator VCO includes an input coupled to the low-pass filter LPF and an output coupled to the phase detector PD as well as the sample selector. The voltage-controlled oscillator VCO generates a VCO phase at its output.

Initially, an incoming data stream is received at the first input of the phase detector PD of the PLL 301. The voltage-controlled oscillator VCO generates a random VCO phase which is received at the second input of the phase detector PD of the PLL 301. The phase detector PD compares the phase of the incoming data stream to the VCO phase generated by the voltage-controlled oscillator VCO to generate a phase error. The phase error is passed to the low-pass filter LPF which removes local noise before being received by the voltage-controlled oscillator VCO. The voltage-controlled oscillator VCO generates an adjusted VCO phase based on the received low-pass filtered phase error. This continues until the VCO phase generated at the output of the voltage-controlled oscillator VCO is aligned with the phase of the incoming data stream.

Figure 4:
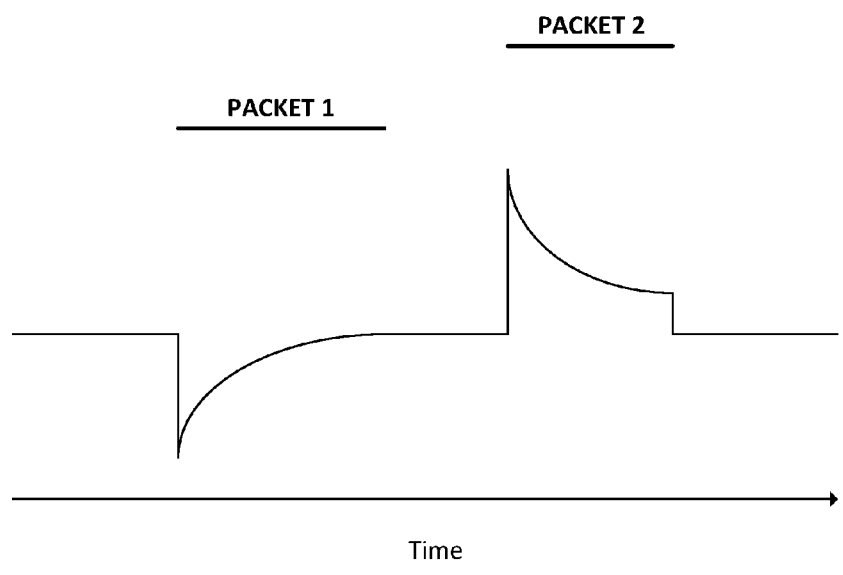
FIG. 4 illustrates the behavior of the PLL of FIG. 3.

FIG. 4 illustrates the behavior of the PLL at measurement point A of FIG. 3. FIG. 4 illustrates the behavior for two different incoming data streams (i.e., packet 1 and packet 2) with different phases. Measurement point A illustrates the phase error at the output of the phase detector PD over time.

As can be seen, when the incoming data stream is first received, a large phase error is generated by the phase detector due to the misalignment between the VCO phase generated at the output of the voltage-controlled oscillator VCO and the phase of the incoming data stream. As the VCO phase is adjusted, the phase error grows smaller until the VCO phase is aligned with the phase of the incoming data stream, at which point no error exists at measurement point A.

While the PLL 301 is performing phase detection on the incoming data stream, the incoming data stream is simultaneously being received by the sample selector. The VCO phase generated by the voltage-controlled oscillator VCO is transmitted to the sample selector to sample the incoming data stream and generate a data stream sample at its output. Because the VCO phase is not initially aligned with the phase of the incoming data stream, the sample selector samples the incoming data unreliably and much of the incoming data stream is lost. It is not until the voltage-controlled oscillator VCO generates a VCO phase that is aligned with the phase of the incoming data stream that the incoming data stream is reliably sampled. In other words, the receiver 300 has a positive locking time (i.e., the time between the start of data stream sampling and the time at which the phase of the data stream is detected is positive) and as such incoming data is lost due to the delay in detecting phase.

Figure 5:
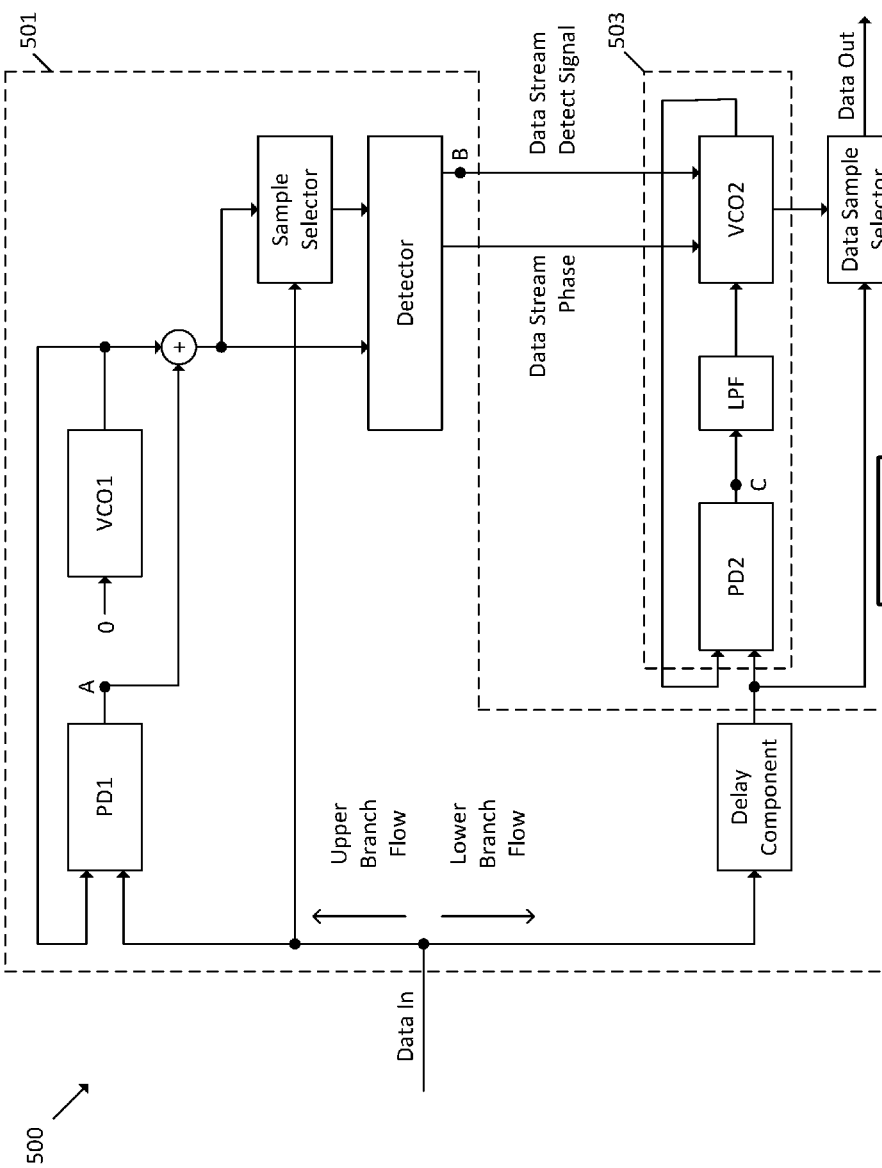
FIG. 5 illustrates an example of a receiver for a bursty data system.

FIG. 5 illustrates a receiver 500 for a bursty data system. The receiver 500 includes a bursty phase detector 501, a phase-locked-loop (PLL) 503, and a data sample selector. The bursty phase detector 501 performs phase detection on an incoming data stream and presets the phase of the PLL 503 to be aligned with the data stream prior to sampling by a sample selector. In this way, the receiver 500 of FIG. 5 is able to perform phase detection with a 0 or negative locking time, which will be discussed in further detail below. Optionally, the incoming data stream may include a preamble segment and a data segment.

The bursty phase detector 501 includes an upper branch (first branch) and a lower branch (second branch). The upper branch includes a voltage-controlled oscillator VCO1, a phase detector PD1, a sample selector, an adder and a signal stream detector. The lower branch includes a delay component.

The phase detector PD1 of the bursty phase detector 501 includes a first input coupled to receive the incoming data stream, a second input coupled to an output of the voltage-controlled oscillator VCO1 of the bursty phase detector 501, and an output coupled to the adder. The phase detector PD1 of the bursty phase detector 501 is configured to generate a phase error at its output. The phase error is based on a comparison between the phase of the incoming data stream and a VCO phase output by the voltage-controlled oscillator VCO1 of the bursty phase detector 501. As will be discussed below, the voltage-controlled oscillator VCO1 of the bursty phase detector 501 is fixed and generates a fixed VCO phase. As such the phase error generated by the phase detector PD1 of the bursty phase detector 501 will be fixed. In some cases, where the incoming data stream includes both a preamble segment and a data segment, the phase detector PD1 of the bursty phase detector 501 may be configured to generate a phase error based on a comparison between the phase of the preamble segment and the VCO phase generated by the voltage-controlled oscillator VCO1 of the bursty phase detector 501. In other embodiments, the phase detector PD1 of the bursty phase detector 501 may be configured to generate a phase error based on a comparison between the phase of the data segment and the phase generated by the voltage-controlled oscillator VCO1 of the bursty phase detector 501.

The voltage-controlled oscillator VCO1 of the bursty phase detector 501 is free-running and as such its input is tied to a fixed value. The output of the voltage-controlled oscillator VCO of the bursty phase detector 501 is coupled to the adder. The voltage-controlled oscillator VCO1 of the bursty phase detector 501 is configured to generate a fixed VCO phase at its output based on the fixed value tied to its input.

The adder includes a first input coupled to the output of the voltage-controlled oscillator VCO1 of the bursty phase detector 501 (e.g., fixed VCO phase) and a second input coupled to the output of the phase detector PD1 of the bursty phase detector 501 (e.g., fixed phase error). The adder combines the VCO phase and the phase error to generate the runtime phase of the incoming data stream at its output. In some cases, where the incoming data stream includes both a preamble segment and a data segment, the runtime phase generated by the adder may be the runtime phase of the preamble segment. In other embodiments, the runtime phase generated by the adder may be the runtime phase of the data segment.

The sample selector of the bursty phase detector 501 includes a first input coupled to an output of the adder, a second input coupled to receive the incoming data stream, and an output coupled to the signal stream detector. The sample selector is configured to sample the incoming data stream using the runtime phase of the incoming data stream (e.g., combined VCO phase and phase error) to generate a data stream sample at its output. In some cases, where the incoming data stream includes both a preamble segment and a data segment, the data stream sample may be a sample of the preamble segment. In some other, the data stream sample may be a sample of the data segment.

The signal stream detector of the bursty phase detector 501 includes a first input coupled to an output of the adder and a second input coupled to the output of the sample selector. The signal stream detector is configured to generate a data stream phase at a first output and a data stream detect signal at a second output using the runtime phase of the incoming data stream (e.g. combined VCO phase and phase error) as well as the data stream sample. The data stream phase is the phase of the incoming data stream. The data stream detect signal is an indication of the start of incoming data from a new transmitter. In some cases, where the incoming data stream includes both a preamble segment and a data segment, the data stream phase may be a preamble segment phase and the data stream detect signal may be a preamble segment detect signal. In other embodiments, the data stream phase may be a data segment phase. Optionally, the preamble segment may be used to trigger the data stream detect signal.

The delay component of the bursty phase detector 501 stores the incoming data stream while the upper branch performs phase detection. Once the phase of the incoming data stream has been detected by the upper branch, the delay component releases the incoming data stream to the PLL 503 and the data sample detector.

During operation, incoming data streams enter the receiver 500 and flow into the upper branch as well as the lower branch. In the upper branch, the incoming data stream is detected and the phase of the incoming data stream is determined. The time it takes to detect the incoming data stream and to determine the phase of the incoming data stream is processing time. In the lower branch, the incoming data stream is stored in the delay component until the upper branch detects the incoming data stream and determines its phase. Optionally, the delay component may store the data stream for a time period equal to the processing time. In other embodiments, the delay component stores the data stream for a time period greater than the processing time.

Once the signal stream detector of the bursty phase detector 501 has detected the phase of the incoming data stream, the signal stream detector injects that phase into the voltage-controlled oscillator VCO2 of the PLL 503, such that the VCO phase generated by the voltage-controlled oscillator VCO2 of the PLL 503 is aligned with the phase of the incoming data stream.

The PLL 503 includes a phase detector PD2, a low-pass filter LPF, and a voltage-controlled oscillator VCO2.

The phase detector PD2 of the PLL 503 includes a first input coupled to the output of the delay (e.g., delayed incoming data stream) and a second input coupled to an output of the voltage-controlled oscillator VCO2 of the PLL 503. The phase detector PD2 of the PLL 503 is configured to generate a phase error at its output.

The low-pass filter LPF includes an input coupled to the output of the phase detector PD2 and an output coupled to an input of the voltage-controlled oscillator VCO2. The low-pass filter LPF is configured to remove local noise associated with the output of the phase detector.

The voltage-controlled oscillator VCO2 of the PLL 503 includes a first input coupled to the low-pass filter LPF, a second input coupled to the data stream phase signal generated by the signal stream detector, a third input coupled to receive the data stream detect signal generated by the signal stream detector, and an output coupled to the phase detector PD2 of the PLL 503 as well as the data sample selector. The voltage-controlled oscillator VCO2 of the PLL 503 generates a VCO phase at its output which is coupled to the second input of the phase detector PD2 of the PLL 503 and the data sample selector. The voltage-controlled oscillator VCO2 of the PLL 503 generates the VCO phase at its output based on the output of the low-pass filter LPF (e.g., phase error filtered to remove local noise), the data stream phase, and the data stream detect signal, as described in greater detail below.

As mentioned above, once the signal stream detector in the upper branch has detected the phase of the incoming data stream, the signal stream detector injects that phase into the voltage-controlled oscillator VCO2 of the PLL 503, such that the VCO phase generated by the voltage-controlled oscillator VCO2 of the PLL 503 is aligned with the phase of the incoming data stream. Thus, when the phase detector PD2 of the PLL 503 compares the phase of the incoming data stream to the VCO phase generated by the voltage-controlled oscillator VCO2 of the PLL 503, a minimal phase error is generated. This minimal phase error is passed to the low-pass filter LPF which removes local noise before being received by the voltage-controlled oscillator VCO2 of the PLL 503. Because the low-pass filtered phase error is minimal, the voltage-controlled oscillator VCO2 of the PLL 503 continues to generate a VCO phase that is aligned with the phase of the incoming data.

The data sample selector receives the incoming data stream from the output of the delay component at the same time that the PLL 503 receives the incoming data stream. The data sample selector is also coupled to the output of the voltage-controlled oscillator VCO2 of the PLL 503 and uses the VCO phase generated by the voltage-controlled oscillator VCO2 to sample the incoming data stream. Because the VCO phase generated by the voltage-controlled oscillator VCO2 of the PLL 503 is aligned with the phase of the incoming data stream at the time the data sample selector begins receiving the incoming data stream, the incoming data stream is reliably sampled without any data loss.

Figure 6:
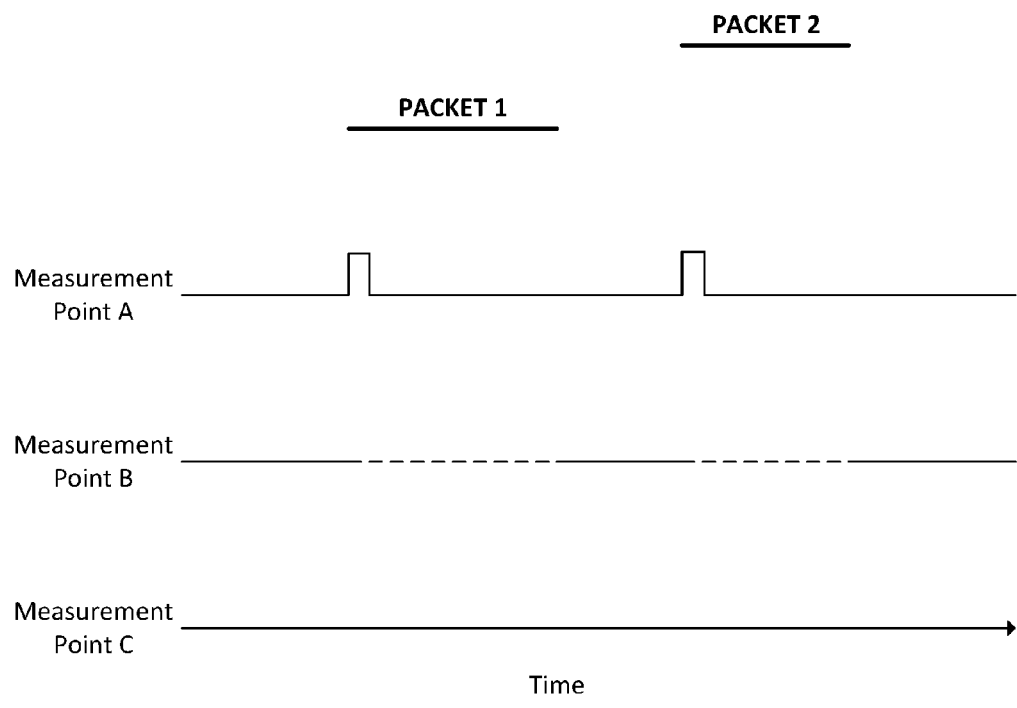
FIG. 6 is a graphical illustration of the behavior of the receiver of FIG. 5.

FIG. 6 is a graphical illustration of the behavior of the receiver 500 of FIG. 5. As soon as the incoming data stream flows into the upper branch, its phase is compared against the VCO phase generated by the voltage-controlled oscillator VCO1 of the bursty phase detector 501 to generate a phase error at measurement point A in FIG. 5. This phase error is illustrated in FIG. 6. Because the VCO phase is fixed, as described above, so too is the phase error. The phase error is combined with the VCO phase at the adder to generate the runtime phase of the incoming data stream at the output of the adder as shown in of FIG. 5.

As described above, the sample selector of the bursty phase detector 501 is configured to sample the incoming data stream using the runtime phase of the incoming data (e.g., combined VCO phase and phase error) to generate a data stream sample at its output. The signal stream detector of the bursty phase detector 501 is configured to generate a data stream phase at a first output and a data stream detect signal at a second output (i.e., measurement point B) using the combined VCO phase and phase error (i.e., runtime phase of the incoming data stream) as well as the data stream sample as described above. The data stream detect signal at measurement point B is illustrated in FIG. 6. In some cases, where the incoming data stream includes a preamble segment and a data segment, the data stream detect signal is a signal that indicates a preamble segment has been detected and not a data segment.

The data stream phase and the data stream detect signal are output to the PLL 503 which aligns the VCO phase generated by the voltage-controlled oscillator VCO2 of the PLL 503 with the phase of the incoming data stream. Thus, when the incoming data stream is output from the delay component in the lower branch to the phase detector PD2 of the PLL 503, the phase error generated by the output of the phase detector PD2 of the PLL 503 at measurement point C will be minimal as illustrated in FIG. 6. This is because the point at which the receiver 500 detects the phase of the incoming data stream occurs at the same time or earlier than the start of data sampling by the data sample selector. In other words, the locking time for the receiver 500 is 0 or negative. This is in contrast to the phase error output by the phase detector of the PLL 301 in FIG. 3, where a positive locking time is involved.

Thus, the receiver 500 of FIG. 5 has the ability to perform phase detection with a 0 or negative locking time, thus ensuring that data loss doesn't occur during sampling. Additionally, the receiver 500 of FIG. 5 may be implemented with standard electronics without any speed requirements. Rather than dedicating custom electronics with a high operating speed and high cost for performing phase detection, standard electronics that operate at any speed may be used. This reduces costs and allows for flexible operation of the receiver 500. Moreover, the receiver 500 of FIG. 5 may be configured to perform phase detection on incoming data streams with or without preamble segments. This provides for flexible operation of the receiver and may also reduce bandwidth consumption in situations where the incoming data stream does not include a preamble segment. Preamble segments are not constrained to be a certain length and may be adjusted depending on the particular application.

Figure 7:
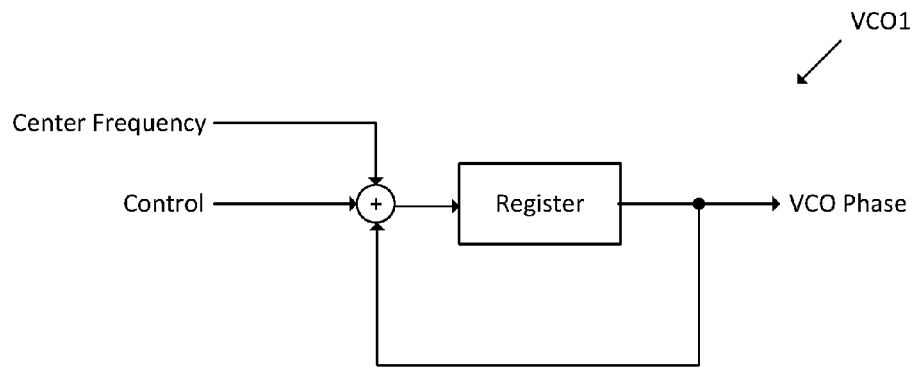
FIG. 7 illustrates a detailed view of the voltage controlled oscillator VCO1 of the bursty phase detector in FIG. 5.

FIG. 7 illustrates a detailed view of the voltage controlled oscillator VCO1 of the bursty phase detector 501 in FIG. 5. The voltage-controlled oscillator VCO1 includes a register and an adder. An input of the register is coupled to the output of the adder and an output of the register is coupled to a first input of the adder. The adder also includes a second input coupled to receive a control signal and a third input coupled to receive a center frequency signal.

The control signal received by the voltage-controlled oscillator VCO1 is that shown in FIG. 5. In FIG. 5, the control signal being received by the voltage-controlled oscillator VCO1 is a fixed value (e.g., 0). The center frequency signal is not shown in FIG. 5 and is a value that is set internally based on the operating frequency of the transmitters that are time-sharing the receiver. The voltage-controlled oscillator VCO1 generates a VCO phase at its output based on the center frequency signal, control signal, and output of the register. The VCO phase generated by the voltage-controlled oscillator VCO1 changes as the control signal being received by the adder changes. However, because the voltage-controlled oscillator VCO1 of the bursty phase detector 501 in FIG. 5 is controlled by a fixed value control signal, the VCO phase generated at the output of the voltage-controlled oscillator VCO1 remains fixed.

Figure 8:
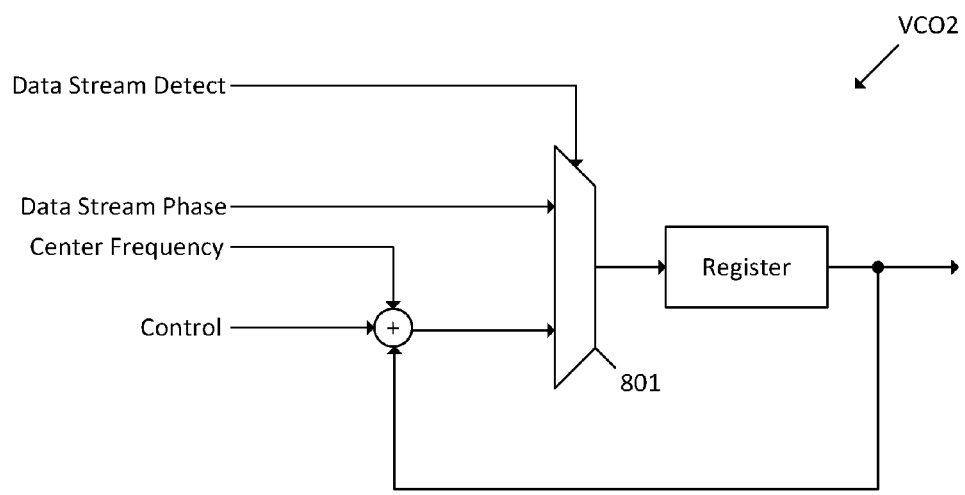
FIG. 8 illustrates a detailed view of the voltage controlled oscillator VCO2 of the PLL in FIG. 5.

FIG. 8 illustrates a detailed view of the voltage controlled oscillator VCO2 of the PLL 503 in FIG. 5. The voltage-controlled oscillator VCO2 includes a register, a multiplexer 801, and an adder. An input of the register is coupled to the output of the multiplexer 801 and an output of the register is coupled to a first input of the adder. A first input of the multiplexer 801 is coupled to receive the data stream phase signal generated by the signal stream detector of the bursty phase detector 501, a second input of the multiplexer 801 is coupled to an output of the adder, and a control input of the multiplexer 801 is coupled to receive the data stream detect signal generated by the signal stream detector of the bursty phase detector 501. The adder also includes a second input coupled to receive a control signal and a third input coupled to receive a center frequency signal.

The control signal received by the voltage-controlled oscillator VCO2 is that shown in FIG. 5, namely the output of the low-pass filter LPF (e.g., phase error filtered for noise). The center frequency signal is not shown in FIG. 5 and is a value that is set internally based on the operating frequency of the transmitters that are time-sharing the receiver. When the signal stream detector in the burst phase detector 501 generates a data stream detect signal, it causes the multiplexer 801 of the voltage-controlled oscillator VCO2 of the PLL2 to select the data stream phase and as such the voltage-controlled oscillator VCO2 generates a VCO phase at its output that is aligned with the phase of the incoming data stream. The VCO phase generated at the output of the voltage-controlled oscillator VCO2 of the PLL 503 continues to be aligned with the phase of the incoming data stream until a different data stream detect signal is received by the voltage-controlled oscillator VCO2 of the PLL 503.

As already mentioned above, the receiver 500 of FIG. 5 has several advantages over other techniques for handling bursty data systems. The receiver 500 of FIG. 5 has the ability to perform phase detection with a 0 or negative locking time, thus ensuring that data loss doesn't occur during sampling. Additionally, the receiver 500 of FIG. 5 may be implemented with standard electronics without any speed requirements. Rather than dedicating custom electronics with a high operating speed and high cost for performing phase detection, standard electronics that operate at any speed may be used. This reduces costs and allows for flexible operation of the receiver. Moreover, the receiver 500 of FIG. 5 may be configured to perform phase detection on incoming data streams with or without preamble segments. This provides for flexible operation of the receiver and may also reduce bandwidth consumption in situations where the incoming data stream does not include a preamble segment. Preamble segments are not constrained to be a certain length and may be adjusted depending on the particular application.

Figure 9:
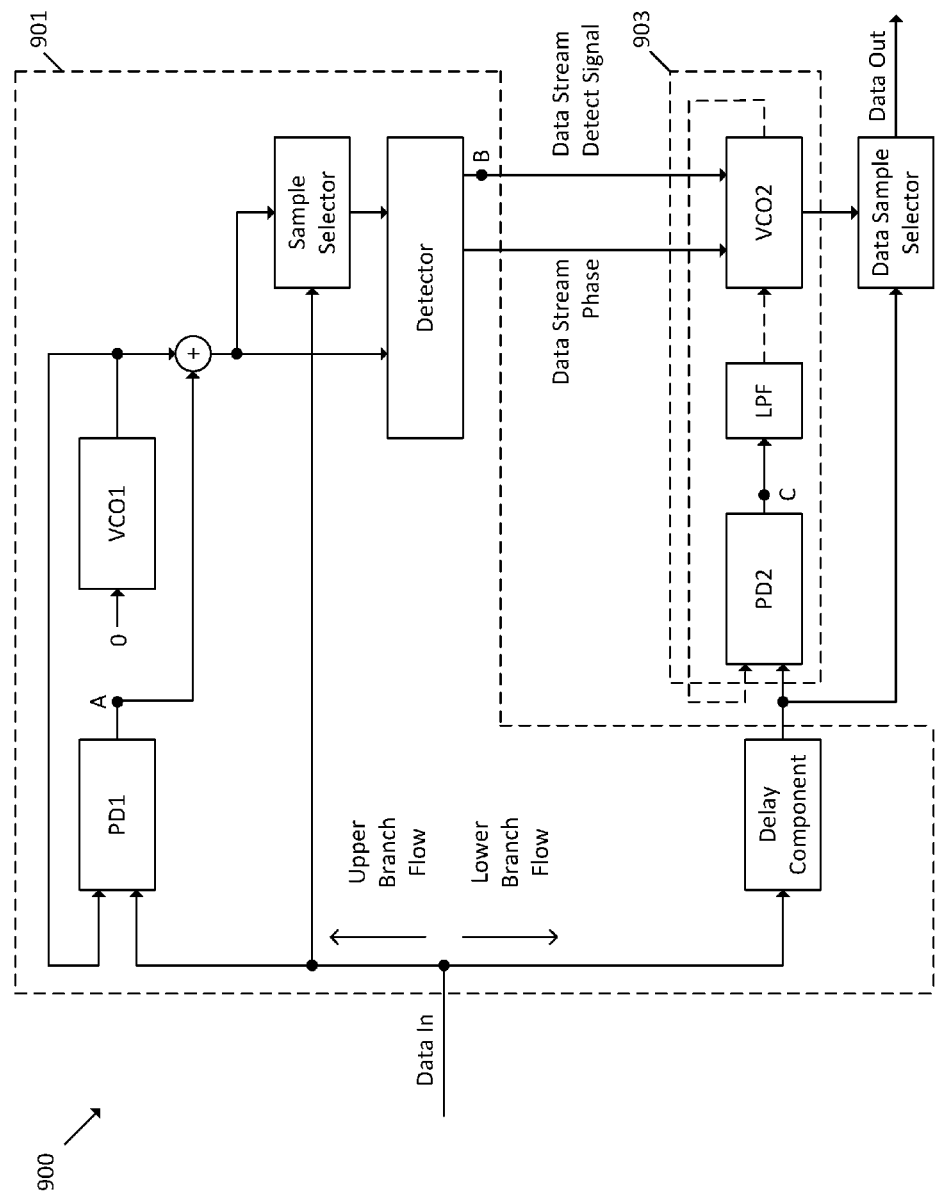
FIG. 9 illustrates an example of a receiver for a bursty data system configured to support fractional relationships.

FIG. 9 illustrates another example of a receiver 900 for a bursty data system that supports fractional relationships. The receiver 900 includes a bursty phase detector 901 (which may be the same or similar to the bursty phase detector 501 discussed previously), a clocking circuit 903, and a data sample selector. The bursty phase detector 901 performs phase detection on an incoming data stream as discussed above in regard to bursty phase detector 501. In order to support fractional relationships between a reference clock frequency and an output frequency, the clocking circuit 903 has a different configuration and function as those described with reference to the clocking circuit 503.

In particular, the voltage controlled oscillator (VCO2) of the clocking circuit 903 is disconnected from the low pass filter (LPF) and the phased detector (PD2). This allows voltage-controlled oscillator VCO2 to operate independently from the low pass filter LPF and/or the phase detector PD2 of the clocking circuit 903, which enables voltage-controlled oscillator VCO2 to operate at frequencies unsupported by the clocking circuit 503 illustrated in FIG. 5. Because the voltage-controlled oscillator VCO2 does not receive input from the low pass filter LPF, and does not provide output for the phase detector PD2, the configuration and operation of the voltage-controlled oscillator VCO2 in the clocking circuit 903 are different from those of the voltage-controlled oscillator VCO2 in the clocking circuit 503. An example of the voltage-controlled oscillator VCO2 for the clocking circuit 903 will be described with reference to FIG. 10 below.

In some embodiments, the clocking circuit 903 may have additional or fewer circuits. For instance, the clocking circuit 903 may include only the voltage-controlled oscillator VCO2 to achieve less overall real-estate of a semiconductor substrate. In such cases, the phase detector PD2 and the low pass filter LPF may be considered separate from the clocking circuit 903. In other embodiments, the clocking circuit 903 may optionally include circuit(s) that allows a feedback path of the clocking circuit 903 to be enabled and disable depending on the circumstances. For instance, the clocking circuit 903 may include switching circuit(s) for managing the interconnection of the components in the clocking circuit 903. Furthermore, in other cases, the clocking circuit 903 may include switching circuits that enable or disable the voltage sources connected to the phase detector PD2 and the low pass filter LPF, thereby lowering power consumption as well as disabling the components.

In some cases, the voltage controlled oscillator VCO2 may support non-fractional mode (that utilizes the phase detector PD2 and low pass filter LPF as illustrated in FIG. 5) as well as fractional mode. In such multimode scenario, the control signal may either be zero when in a mode that supports fractional relationships between the reference frequency and the output frequency, or be the output of the low pass filter LPF when in a mode that supports integer relationships between the reference frequency and the output frequency. In such cases, the voltage controlled oscillator VCO2 of the clocking circuit 903 may be configured to selectively couple to the low pass filter LPF. This may be accomplished through switching between various permutations of disconnecting the low pass filter LPF, pulling down the control input, or disabling the low pass filter LPF. In one technique, in order to conserve energy and to avoid generating unnecessary noise and heat within the circuit, the unused components (e.g., the phase detector PD2 and low pass filter LPF) may be disabled when in the mode that supports fractional relationships, by for instance power gating or disconnecting their inputs and/or outputs. In other cases, the voltage controlled oscillator VCO2 may support only fractional relationships between the reference frequency and the output frequency. In such cases, the voltage controlled oscillator VCO2 may be completely disconnected from the low pass filter LPF, and operation of the voltage-controlled oscillator VCO2 will not rely on output from the low pass filter LPF.

Figure 10:
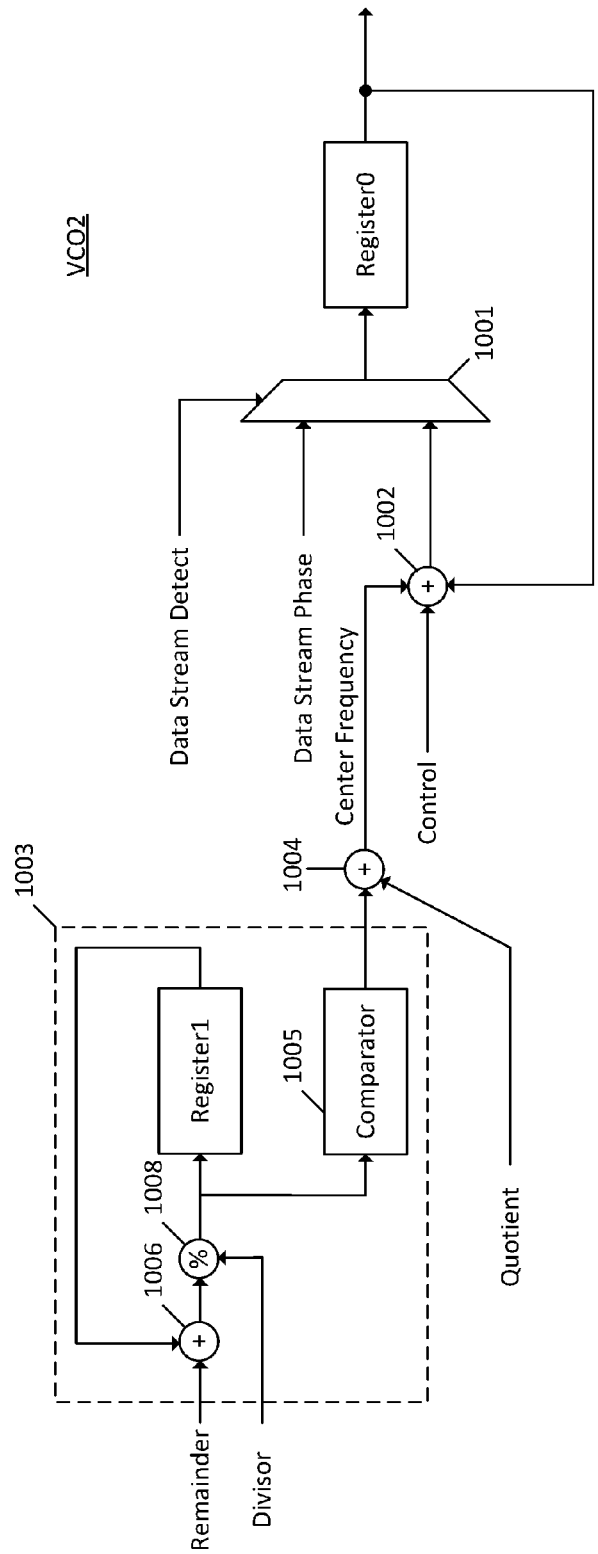
FIG. 10 illustrates a detailed view of the voltage controlled oscillator VCO2 of the PLL in FIG. 9 that supports fractional relationships.

FIG. 10 illustrates the voltage controlled oscillator VCO2 of the clocking circuit 903 of FIG. 9 that supports fractional relationships. The voltage controlled oscillator VCO2 includes a register (register0), a multiplexer 1001, and a first adder 1002. An input of the register is coupled to receive an output from the multiplexer 1001, and an output of the register is configured to provide an input to a first input of the first adder 1002. A first input of the multiplexer 1001 is configured to receive the data stream phase signal generated by the signal stream detector of the bursty phase detector 901, a second input of the multiplexer 1001 is configured to receive an output of the first adder 1002, and a control input of the multiplexer 1001 is coupled to receive the data stream detect signal generated by the signal stream detector of the bursty phase detector 901. The first adder 1002 also includes a second input configured to receive a control signal, and a third input configured to receive a center frequency signal.

The control signal is for selectively connecting the voltage-controlled oscillator VCO2 to the low pass filter LPF, and disconnecting the voltage-controlled oscillator VCO2 from the low pass filter LPF during different modes of operation. As discussed, during a mode that supports fractional relationship(s) between the reference frequency and the output frequency, the voltage-controlled oscillator VCO2 is to be disconnected from the low pass filter LPF. This will cause the voltage-controlled oscillator VCO2 to be disconnected from the feedback loop in the clocking circuit 903. If the voltage-controlled oscillator VCO2 is not disconnected from the feedback loop, the clocking circuit 903 will attempt to adjust the fractional component or remainder from the output of the voltage-controlled oscillator VCO2, rendering the clocking circuit 903 incapable of supporting the fractional relationship(s). During a mode that supports integer relationship(s), the voltage-controlled oscillator VCO2 is to be connected to the low pass filter LPF. In some cases, the control signal may be provided from a separate module (e.g., circuit).

The voltage-controlled oscillator VCO2 of FIG. 10 is similar to that described with reference to FIG. 8, except that additional circuitry is provided including sigma-delta circuit 1003, and a second adder 1004. The additional circuitry enables the voltage-controlled oscillator VCO2 of FIG. 10 to support fractional relationships between the output frequency and the reference frequency.

The sigma-delta circuit 1003 comprises an adder 1006 (e.g., a third adder), a modulus circuit 1008, a register (register1), and comparator 1005. The adder 1006 has a first input configured to receive a remainder, and a second input configured to receive the output of register1. The modulus circuit 1008 has a first input configured to receive an output from the adder 1006, and a second input configured to receive a divisor. The input of the Register1 and the input of the comparator 1005 are configured to receive the output of the modulus circuit 1008. The comparator 1005 may be configured to receive the remainder, and may have a memory (e.g., storage component) for storing the remainder. In other cases, the comparator 1005 may have an input coupled to receive the remainder. In some embodiments, register0 is a n-bit register and register1 is a m-bit register.

In the embodiments discussed with reference to FIG. 5, the center frequency is an integer value, and that integer value remains the same for the duration of the individual data stream. On the other hand, the sigma-delta circuit 1003 of FIG. 10 can modulate the center frequency by one or zero. In essence the sigma-delta circuit 1003 provides the fractional component of the frequency relationship. Here, center frequency=Fout/Frefclk, which according to the Euclidean division algorithm, may be represented by: center frequency=Fout/Frefclk=Quotient+Remainder/Divisor.
Where the quotient is equal to the integer portion of the equation.

In operation, the sigma-delta circuit 1003 outputs a zero or a one. The sigma-delta circuit 1003 outputs a "1" (one) whenever the output of the modulus circuit 1008 is less than the remainder as determined by the comparator 1005, and outputs a "0" (zero) whenever the output of the modulus circuit 1008 is not less then the remainder as determined by the comparator 1005. For instance, if the divisor equals 31, and the remainder equals 7, the sigma-delta circuit 1003 will output a 1 once every 4 or 5 cycles.

In the first cycle, register1 is set to zero, and the third adder 1006 receives (1) a remainder of 7, and (2) the output of the register1 , which is zero in the example. The third adder 1006 performs the addition of 7+0=7, and outputs this result of "7" to the modulus circuit 1008. The modulus of 7 with 31 is 7. This output ("7") from the modulus circuit 1008 is transmitted to the register1 for storage, and is also transmitted to the comparator 1005. The comparator 1005 compares this 7 with the remainder of 7, and determines that the output of the modulus circuit 1008 ("7" in the example) is not less than the remainder of 7. Therefore, a 0 is output by the comparator 1005 of the sigma-delta circuit 1003.

In the next cycle, the remainder remains at 7, but the output of register1 is now 7. The third adder 1006 performs the addition 7+7=14, and outputs this result to the modulus circuit 1008. The modulus of 14 with the divisor of 31 is 14. This output ("14") from the modulus circuit 1008 is transmitted to the register1 for storage, and is also transmitted to the comparator 1005. The comparator 1005 compares 14 with the remainder of 7, and determines that 14 is not less than the remainder of 7. Therefore, the comparator 1005 of the sigma-delta circuit 1003 outputs a 0.

In the next cycle, the remainder remains at 7, but the output of register1 is now 14. The third adder 1006 performs the addition 7+14=21, and outputs this result to the modulus circuit 1008. The modulus of 21 with the divisor of 31 is 21. This output ("21") from the modulus circuit 1008 is transmitted to the register1 for storage, and is also transmitted to the comparator 1005. The comparator 1005 compares 21 with the remainder of 7, and determines that 21 is not less than the remainder of 7. Therefore, the comparator 1005 of the sigma-delta circuit 1003 outputs a 0.

In the next cycle, the remainder remains at 7, but the output of register1 is now 21. The third adder 1006 performs the addition 7+21=28, and outputs this result to the modulus circuit 1008. The modulus of 28 with the divisor of 31 is 28. This output ("28") from the modulus circuit 1008 is transmitted to the register1 for storage, and is also transmitted to the comparator 1005. The comparator 1005 compares 28 with the remainder of 7, and determines that 28 is not less than the remainder of 7. Therefore, the comparator 1005 of the sigma-delta circuit 1003 outputs a 0.

In the next cycle, the remainder remains at 7, but the output of register1 is now 28. The third adder 1006 performs the addition 7+28=35, and outputs this result to the modulus circuit 1008. The modulus of 35 with the divisor of 31 is 4. This output ("4") from the modulus circuit 1008 is transmitted to the register1 for storage, and is also transmitted to the comparator 1005. The comparator 1005 compares 4 with the remainder of 7, and determines that 4 is less than the remainder of 7. Therefore, the comparator 1005 of the sigma-delta circuit 1003 outputs a 1.

In the next cycle, the remainder remains at 7, but the output of the register1 is now 4. The third adder 1006 performs the addition 7+4=11. The third adder 1006 outputs this result to the modulus circuit 1008. The modulus of 11 with 31 is 11. This output ("11") from the modulus circuit 1008 is transmitted to the register1 for storage, and is also transmitted to the comparator 1005. The comparator 1005 compares 11 with the remainder of 7, and determines that 11 is not less than the remainder of 7. Therefore a 0 is again is output by the comparator 1005 of the sigma-delta circuit 1003. It should be noted that throughout the above processing cycles, the data stream remains the same.

As shown in the above example, the sigma-delta circuit 1003 provides a regular adjustment to the center frequency when combined with the quotient at the second adder 1004. Specifically, the output of the sigma-delta circuit 1003 is added to the quotient at adder 1004. This value then becomes the value of the center frequency input into 1002. In effect, the output of the sigma-delta circuit 1003 provides a periodic or near periodic increase to the sampling frequency used to capture data. In this way, the center frequency is adjusted to provide ongoing corrections for the drift in a sampling frequency, and thereby supporting fractional relationships between the reference frequency and the output frequency. Following the above example, and using "100" as an example of the quotient, the adding of the comparator's output to the quotient will result in the following center frequency outputs (out frequency):

| Quotient | Remainder | Register1 | Comparator input | Comparator output | Center Frequency |
|---|---|---|---|---|---|
| 100 | 7 | 0 | 7 | 0 | 100 |
| 100 | 7 | 7 | 14 | 0 | 100 |
| 100 | 7 | 14 | 21 | 0 | 100 |
| 100 | 7 | 21 | 28 | 0 | 100 |
| 100 | 7 | 28 | 35 | 1 | 101 |
| 100 | 7 | 4 | 11 | 0 | 100 |
| 100 | 7 | 11 | 18 | 0 | 100 |
| 100 | 7 | 18 | 25 | 0 | 100 |
| 100 | 7 | 25 | 32 | 1 | 101 |
| 100 | 7 | 1 | 8 | 0 | 100 |
| 100 | 7 | 8 | 15 | 0 | 100 |
| 100 | 7 | 15 | 22 | 0 | 100 |
| 100 | 7 | 22 | 29 | 0 | 100 |
| 100 | 7 | 29 | 36 | 1 | 101 |
| 100 | 7 | 5 | 13 | 0 | 100 |
| 100 | 7 | 13 | 20 | 0 | 100 |
| 100 | 7 | 20 | 27 | 0 | 100 |
| 100 | 7 | 27 | 34 | 1 | 101 |
| 100 | 7 | 3 | 10 | 0 | 100 |
| 100 | 7 | 10 | 17 | 0 | 100 |
| 100 | 7 | 17 | 24 | 0 | 100 |
| 100 | 7 | 24 | 31 | 1 | 101 |

Similar to the operation of the circuit illustrated in FIG. 5, the center frequency for FIGS. 9-10 are set based on the operating frequency of the transmitters that are time-sharing the receiver. When the signal stream detector in the burst phase detector 901 generates a data stream detect signal, it causes the multiplexer 1001 of the voltage-controlled oscillator VCO2 in the clocking circuit 903 to select the data stream phase. As such, the voltage-controlled oscillator VCO2 generates a VCO phase at its output that is aligned with the phase of the incoming data stream. However, the VCO phase generated at the output of the voltage-controlled oscillator VCO2 of the clocking circuit 903 may drift with respect to the phase of the incoming data stream. Therefore, the sigma-delta circuit 1003 provides regular correction with respect to the phase of the incoming data stream, so that the drift may be reduced or eliminated.

As shown in the above embodiments, the clocking circuit 903 is configured to operate based on a fractional relationship between a reference clock frequency and an output frequency (e.g., center frequency). In some cases, the output frequency is the same as the data stream frequency. Also, the reference clock frequency and the sample frequency may have an integer relationship (e.g., may have a ratio of 1). Thus, by configuring the clocking circuit 903 to support a fractional relationship between the reference clock frequency and the output frequency, the clocking circuit 903 also supports a fractional relationship between the sample frequency and the frequency of the data stream.

Figure 11:
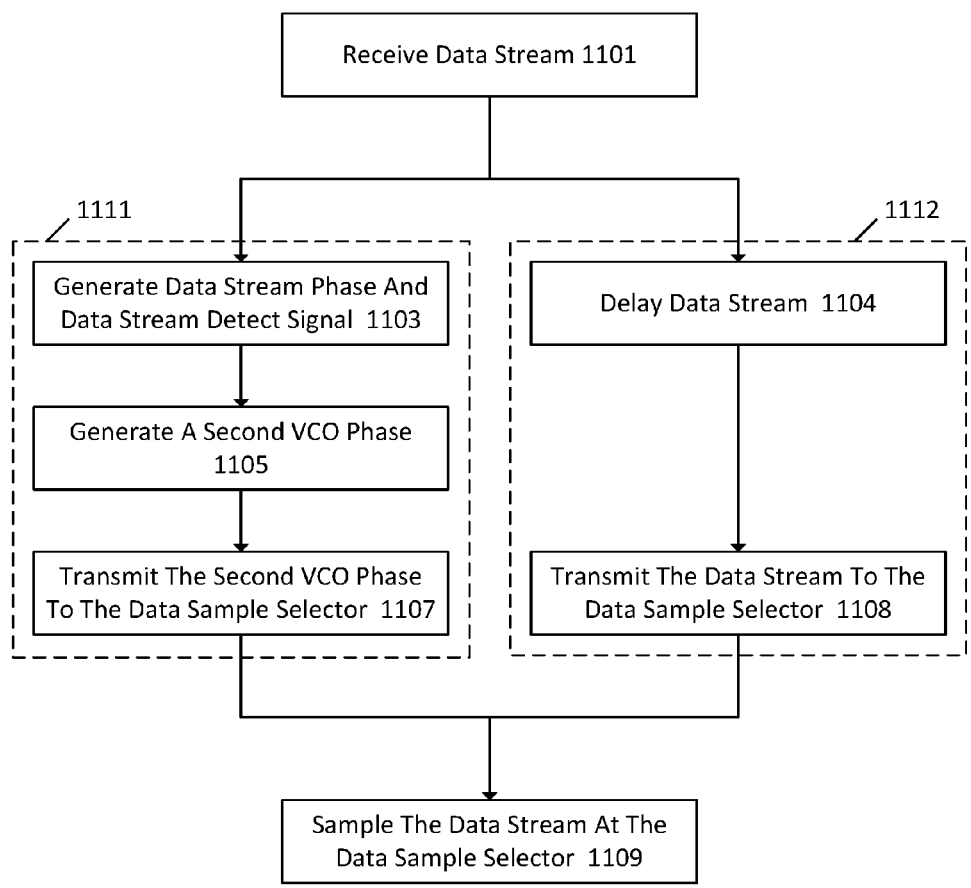
FIG. 11 illustrates a flowchart of an approach to implementing data stream sampling using a bursty data system.

FIG. 11 illustrates a method for data stream sampling using a bursty data system. The method includes, receiving a data stream as an input (item 1101). The method then proceeds to a first sub-method 1111 and a second sub-method 1112. The items in the first sub-method 1111 correspond to the upper branch of a bursty data system as described with reference to FIGS. 9-10. The items in the second sub-method 1112 correspond to the lower branch of a bursty data system as described with reference to FIGS. 9-10. The first sub-method 1111 includes generating a data steam phase and a data stream detect signal (item 1103) which uses at least a first VCO phase, generating a second VCO phase (item 1105), transmitting the second VCO phase to the data sample selector (item 1107). The second sub-method 1112 includes at least delaying that data stream where it feeds into the data sample selector (item 1104) before it is transmitted to the data sample selector (item 1108). Finally, the data stream is and sampled at the data sample selector using the second VCO phase (item 1109).

At item 1101, a data stream is received at a bursty system such as the one illustrated in FIGS. 9-10. Additionally, the data stream is routed to a first sub-method 1111 and a second sub-method 1112. While various types of data streams may be received, the present discussion will be limited to receiving bursty data streams. In some embodiments the data stream may be a bursty data stream that requires a fractional relationship between an output frequency and a reference frequency for accurate and reliable sampling.

In the first sub-method 1111, at item 1103, a data stream phase and a data stream detect signal are generated, which by way of example may be performed by utilizing the phase detector PD1, the first voltage-controlled oscillator VCO1, the adder which is configured to receive the outputs of phase detector PD1 and the first voltage-controlled oscillator VCO1, the sample selector, and the detector as illustrated in FIG. 9.

Then at item 1105 a second VCO phase is generated using the voltage controlled oscillator VCO2, wherein the second VCO phase is generated using a clocking circuit which supports fractional relationships between the reference clock and the output frequency as illustrated and discussed with reference to FIGS. 9-10. The details of item 1105 are described with reference to FIGS. 9-10, and therefore will not be repeated herein.

At item 1107, the second VCO phase is transmitted to the data sample selector (such as that described with reference to FIG. 9).

At the same time that the first sub-method 1111 is being performed to generate the second VCO phase, the second sub-method 1112 is being perform to delay the data stream between the input and the data sample selector.

At item 1104, a delay component, such as the delay component described with reference to FIG. 9, is used to delay the data stream. In some embodiments the delay component delays the data stream for the amount of time required for the first sub-method 1111 to perform at least items 1103 and 1105. In other embodiments the amount of time may be greater than or equal to the amount of time required for the first sub-method 1111, or equal to the amount of time required for the first sub-method 1111 plus some prescribed amount (e.g., minimum threshold) of time.

At item 1108, the data stream is transmitted to the data sample selector described with reference to FIG. 9.

At item 1109, the data sample selector receives the second VCO phase and the data stream, accurately and reliably samples the data stream.

As used in this specification, the term "output" may refer to an output signal, or a physical output (e.g., port, node, connection, etc.) of a component. Similarly, the term "input" may refer to an input signal, or a physical input (e.g., port, node, connection, etc.) of a component. Also, "first output" and "second output" may refer to separate physical outputs, or to a single physical output that is configured for, or is capable of, outputting first and second output signals. Similarly, "first input" and "second input" may refer to separate physical inputs, or to a single physical input that is configured for, or is capable of, receiving first and second input signals.

Although particular embodiments have been shown and described, it will be understood that they are not intended to limit the claimed invention, and it will be clear to those skilled in the art that various changes and modifications may be made without departing from the claimed invention. The specification and drawings are, accordingly, to be regarded in an illustrative rather than restrictive sense. The claimed invention is intended to cover modifications and alternatives.

What is claimed is:

1. A receiver for processing a data stream, comprising:
   a bursty phase detector having a first voltage-controlled oscillator (VCO) configured to provide a first VCO phase, a signal stream detector configured to provide a data stream phase and a data stream detect signal, and a delay component configured to receive the data stream;
   a clocking circuit coupled to receive an output of the delay component, the data stream phase, and the data stream detect signal, the clocking circuit configured to provide a second VCO phase at an output of the clocking circuit, wherein the clocking circuit is configured to operate based on a fractional relationship between a reference clock frequency and an output frequency;
   a data sample selector with a first input coupled to the output of the delay component, and a second input coupled to the output of the clocking circuit;
   wherein the receiver further comprises a second voltage-controlled oscillator, and a low-pass filter; and
   wherein an output of the low-pass filter is decoupled from the second voltage-controlled oscillator at least when supporting the fractional relationship between the reference clock frequency and the output frequency.

2. The receiver of claim 1, wherein the bursty phase detector further comprises:
   a first phase detector with a first input coupled to receive the data stream, and a second input coupled to the first voltage-controlled oscillator, the first phase detector configured to provide a first phase error; and
   a sample selector coupled to receive a sum of the first VCO phase and the first phase error, and to receive the data stream, the sample selector configured to provide a data stream sample;
   wherein the signal stream detector is coupled to the sample selector, and wherein the signal stream detector is configured to receive the sum of the first VCO phase and the first phase error, and to generate the data stream phase and the data stream detect signal.

3. The receiver of claim 1, wherein the data stream comprises a preamble segment and a data segment.

4. The receiver of claim 3, wherein the preamble segment is for triggering the signal stream detector to generate the data stream detect signal.

5. The receiver of claim 2, further comprising an adder for generating the sum of the first VCO phase and the first phase error.

6. The receiver of claim 2, wherein the delay component is configured to store the data stream for a time period greater than, or equal to, a processing time for generating the data stream phase and the data stream detect signal.

7. The receiver of claim 2, wherein the second voltage-controlled oscillator has a first input coupled to receive the data stream phase, and a second input coupled to receive the data stream detect signal; and
   wherein the second voltage-controlled oscillator is configured to provide the second VCO phase at an output of the second voltage-controlled oscillator.

8. The receiver of claim 7, wherein the clocking circuit further comprises:
   a second phase detector with a first input coupled to the output of the delay component,
   wherein the low-pass filter has an input connected to an output of the second phase detector, and wherein the output of the low pass filter is decoupled from the third input of the second voltage-controlled oscillator to generate the second VCO phase that has the fractional relationship between the reference clock frequency and the output frequency.

9. The receiver of claim 8, wherein the second phase detector is configured to receive the data stream from the delay component after the second VCO phase is aligned with a phase of the data stream.

10. The receiver of claim 8, wherein the second voltage-controlled oscillator comprises:
    a first adder coupled to the low-pass filter, wherein the first adder is configured to receive a center frequency signal;
    a multiplexer with a first input coupled to receive the data stream phase, a second input coupled to an output of the first adder, and a control input coupled to receive the data stream detect signal; and
    an n-bit register with an input coupled to an output of the multiplexer, and an output coupled to the first adder.

11. The receiver of claim 10, further comprising a second adder for providing the center frequency signal, wherein the second adder is coupled to a quotient input representing an integer portion of the second VCO phase.

12. The receiver of claim 1, further comprising a sigma-delta circuit, wherein the sigma-delta circuit comprises:
    a m-bit register;
    an adder with a first input configured to receive a remainder, and a second input connected to an output of the m-bit register;
    a modulus circuit connected to the adder and configured to receive a divisor input, wherein the m-bit register is connected to an output of the modulus circuit; and
    a comparator connected to the modulus circuit, wherein the comparator is configured to output a "1" if an input to the comparator is less than the remainder or to output a "0" if the input of the comparator is not less than the remainder.

13. The receiver of claim 8, wherein the low-pass filter is configured to remove local noise associated with the output of the second phase detector.

14. The receiver of claim 8, wherein the second voltage-controlled oscillator is configured to provide the second VCO phase that is aligned with a phase of the data stream based on the data stream phase generated by the signal stream detector.

15. The receiver of claim 1, wherein the output of the low-pass filter is connectable with the second voltage-controlled oscillator when supporting an integer relationship between the reference clock frequency and the output frequency.

16. The receiver of claim 12, wherein an output of the sigma-delta circuit represents a fractional portion of the second VCO phase.

17. The receiver of claim 1, wherein the second voltage-controlled oscillator and the low-pass filter are parts of the clocking circuit.

18. A method for processing a data stream having fractional relationships between a reference clock frequency and an output frequency, the method comprising:
    receiving data at an input of a bursty phase detector generating a data stream phase and a data stream detect signal using the bursty phase detector, wherein the data stream phase is generated based on at least a sum of a first VCO phase and a phase error, and wherein the data stream detect signal is generated based on at least the sum of a first VCO phase and a phase error and the data stream;
    delaying the data stream for a time period greater than, or equal to, a processing time for generating a data stream phase and a data stream detect signal using a delay component of the bursty phase detector;
    generating a second VCO phase using a clocking circuit, wherein the clocking circuit, wherein the clocking circuit is configured to operate based on a fractional relationship between the reference clock frequency and an output frequency;
    transmitting the second VCO phase to a data sample selector;
    performing data sampling on the delayed data stream at the data sample selector based on at least the second VCO phase.
    wherein the second VCO phase is generated using the clocking circuit that comprises a voltage-controlled oscillator, and a low-pass filter; and
    wherein an output of the low-pass filter is decoupled from the voltage-controlled oscillator at least when supporting the fractional relationship between the reference clock frequency and the output frequency.

19. The method of claim 18, wherein the data stream comprises a preamble segment and a data segment, and wherein the generating of the data stream detect signal is triggered by the preamble segment.

20. The method of claim 18, further comprising determining a sum of the VCO phase and a phase error.

21. A receiver for processing a data stream, comprising:
    a bursty phase detector having a first voltage-controlled oscillator configured to provide a first VCO phase, a signal stream detector configured to provide a data stream phase and a data stream detect signal, and a delay component configured to receive the data stream;
    a clocking circuit coupled to receive an output of the delay component, the data stream phase, and the data stream detect signal, the clocking circuit configured to provide a second VCO phase at an output of the clocking circuit, wherein the clocking circuit is configured to operate based on a fractional relationship between a reference clock frequency and an output frequency; an
    a data sample selector with a first input coupled to the output of the delay component, and a second input coupled to the output of the clocking circuit;
    wherein the receiver further comprises a sigma-delta circuit, and wherein the sigma-delta circuit comprises a m-bit register;
    an adder with a first input configured to receive a remainder, and a second input connected to an output of the m-bit register;
    a modulus circuit connected to the adder and configured to receive a divisor input, wherein the m-bit register is connected to an output of the modulus circuit; and
    a comparator connected to the modulus circuit, wherein the comparator is configured to output a "1" if an input to the comparator is less than the remainder or to output a "0" if the input of the comparator is not less than the remainder; and
    wherein the receiver further comprises a second voltage-controlled oscillator and a low-pass filter having an output, wherein the output of the low-pass filter is decoupled from the second voltage-controlled oscillator at least when supporting the fractional relationship between the reference clock frequency and the output frequency.

* * * * *